United States Patent
Orita et al.

(10) Patent No.: US 7,050,472 B2
(45) Date of Patent: May 23, 2006

(54) SEMICONDUCTOR LASER DEVICE AND METHOD FOR MANUFACTURING THE SAME

(75) Inventors: Kenji Orita, Osaka (JP); Atsunori Mochida, Osaka (JP); Masaaki Yuri, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/795,959

(22) Filed: Feb. 28, 2001

(65) Prior Publication Data
US 2001/0019567 A1    Sep. 6, 2001

(30) Foreign Application Priority Data
Mar. 1, 2000    (JP) ............................. 2000-055291
Apr. 3, 2000    (JP) ............................. 2000-100304

(51) Int. Cl.
*H01S 5/00*    (2006.01)
(52) U.S. Cl. ............................. 372/46; 372/43; 372/45
(58) Field of Classification Search .................. 372/45, 372/43, 46
See application file for complete search history.

(56) References Cited

U.S. PATENT DOCUMENTS

| | | | | |
|---|---|---|---|---|
| 4,872,174 A | * | 10/1989 | Matsui et al. .................. | 372/45 |
| 5,292,685 A | | 3/1994 | Inoguchi et al. ............. | 437/107 |
| 5,303,255 A | * | 4/1994 | Kudo et al. .................... | 372/46 |
| 5,321,712 A | * | 6/1994 | Itaya et al. ..................... | 372/43 |
| 5,880,028 A | | 3/1999 | Yamamoto et al. | |
| 6,023,484 A | * | 2/2000 | Matsumoto et al. ......... | 372/46 |

FOREIGN PATENT DOCUMENTS

| | | |
|---|---|---|
| EP | 0 390 995 | 10/1990 |
| EP | 0 526 128 | 2/1993 |
| EP | 0 905 837 | 3/1999 |
| JP | 60-066484 | 4/1985 |
| JP | 5-283805 | 10/1993 |
| JP | 6-112580 | 4/1994 |

OTHER PUBLICATIONS

David Wood: "Optoelectronic semiconductor devices", 1994, Prentice Hall Int. Series in Optoelectronics, UK XP-002260008, p. 184.

* cited by examiner

*Primary Examiner*—Min Sun Harvey
*Assistant Examiner*—Cornelius H. Jackson
(74) *Attorney, Agent, or Firm*—Hamre, Schumann, Mueller & Larson P.C.

(57) ABSTRACT

The invention provides a semiconductor laser device including an active layer, a semiconductor layer provided with a diffraction grating, an etch-stop layer, a cladding layer provided with a stripe structure, and a current blocking layer arranged at least on a side of said stripe structure, formed in that order on a substrate. In this semiconductor laser device, the etching-stop layer is formed on the semiconductor layer with the diffraction grating, so that damage of the diffraction grating due to etching can be prevented. The invention also provides a distributed Bragg reflection semiconductor laser device, including an active layer, and a current blocking layer having a stripe-shaped window and a diffraction grating formed at least near an end face thereof. This semiconductor laser device can be manufactured with fewer crystal growth processes than conventional semiconductor laser devices.

19 Claims, 12 Drawing Sheets

US 7,050,472 B2

SEMICONDUCTOR LASER DEVICE AND METHOD FOR MANUFACTURING THE SAME

BACKGROUND OF THE INVENTION

1. Field of the Invention

The present invention relates to distributed feedback semiconductor lasers and distributed Bragg reflector semiconductor lasers.

2. Description of the Related Art

Distributed feedback (referred to as "DFB" in the following) and distributed Bragg reflector (referred to as "DBR" in the following) are two well-known structures for semiconductor lasers, in which oscillation in a single longitudinal mode is achieved by employing a diffraction grating with excellent wavelength selectivity in the semiconductor optical waveguide. To use such semiconductor lasers as light sources for optical information processing or optical measurements, a so-called transversal mode control is necessary to ensure that the laser oscillates in the basic transversal mode.

For DFB semiconductor lasers, a structure for transversal mode control and current confinement is known, in which a stripe-shaped recess portion (so-called window) is formed in the current blocking layer, as disclosed for example in JP H06-112580A. The following is an explanation of this conventional structure, with reference to FIG. 11.

This DFB semiconductor laser includes an n-type GaAs substrate 101, and formed on top thereof an n-type GaAs buffer layer 102, an n-type $Ga_{0.5}Al_{0.5}As$ first cladding layer 103, a $Ga_{0.85}Al_{0.15}As$ active layer 104, a p-type $Ga_{0.5}Al_{0.5}As$ first optical guiding layer 105, and a p-type $Ga_{0.8}Al_{0.2}As$ diffraction grating layer 106. Formed on top of that are an n-type $Ga_{0.4}Al_{0.6}As$ current blocking layer 109 having a stripe-shaped window 109a for current confinement, and a p-type GaAs protective layer 112. Furthermore, a p-type $Ga_{0.5}Al_{0.5}As$ second cladding layer 110 and a p-type GaAs contact layer 111 are formed on top of the protective layer 112 and the stripe-shaped window 109a.

In another well-known DFB semiconductor laser, a diffraction layer 106 having a diffraction grating 106a is formed below the active layer 104.

However, these conventional structures pose the following problems:

(1) The etching for the formation of the stripe-shaped window 109a degrades the shape of the diffraction grating 106a, and it is difficult to achieve single longitudinal mode characteristics with high yield.
(2) In the portion in which the thickness of the diffraction grating layer 109 has become thinner due to the formation of the diffraction grating 106a, over-etching may occur when forming the stripe-shaped window, and the etching may reach the first optical guiding layer 105 below the diffraction grating layer 106, reducing the yield.
(3) When the diffraction grating layer 106 is formed below the active layer 104, the diffraction grating is no longer exposed to the etching, but in that case the active layer 104 is formed on top of the diffraction grating layer 106 with its protrusions and recesses, so that it is difficult to achieve a stable crystal quality and variations in optical properties are increased.

Also known are DBR semiconductor lasers having a different structure to ensure single longitudinal mode oscillation. The following is an explanation of a method for manufacturing such a semiconductor, with reference to FIG. 12.

First of all, as shown in FIG. 12A, an n-type GaAs buffer layer 143, an n-type $Ga_{0.5}Al_{0.5}As$ first cladding layer 144, a $Ga_{0.85}Al_{0.15}As$ active layer 145, a p-type $Ga_{0.5}Al_{0.5}As$ second cladding layer 146, and a grating layer 147 are formed on top of an n-type GaAs substrate 142 in a first crystal growth process. Then, as shown in FIG. 12B, a diffraction grating 147a is formed in the grating layer 147 in a distributed Bragg reflection region 141 by etching the grating layer 147 in this distributed Bragg reflection region 141.

Then, as shown in FIGS. 12C and 12D, a p-type $Ga_{0.5}Al_{0.5}As$ third cladding layer 148 is formed in a second crystal growth process, and a ridge 148a extending in a direction perpendicular to the diffraction grating is formed by etching the p-type $Ga_{0.5}Al_{0.5}As$ third cladding layer 148.

Then, as shown in FIG. 12E, a $SiO_2$ film 150 is formed on the ridge 148a, and using this $SiO_2$ film 150 as a mask for selective growth, an n-type GaAs current blocking layer 149 is formed on the p-type $Ga_{0.5}Al_{0.5}As$ third cladding layer 148 in a third crystal growth process. Finally, as shown in FIG. 12F, the $SiO_2$ film 150 is eliminated by selective etching, and a p-type GaAs contact layer 151 is formed in a fourth crystal growth process.

In the structure of FIG. 12F, a diffraction grating having a periodic structure is formed in the grating layer 147 in the distributed Bragg reflection region 141, so that single longitudinal mode oscillation is possible. Moreover, the forbidden band width of the n-type GaAs current blocking layer 149 is smaller than the energy of the laser light wavelength, so that the laser light is absorbed by the n-type GaAs current blocking layer 149 in the region outside the ridge 148a, the laser light is confined in the ridge 148a and laser oscillation in a single transverse mode is achieved.

However, in the conventional structure shown in FIG. 12, the grating layer is formed between the cladding layers, so that four crystal growth processes have to be carried out, which makes the manufacturing process complicated and lowers the yield. Furthermore, because of the optical absorption of the current blocking layer, the waveguide loss is high, and there is the problem that the operating current is large. In addition, because of the optical absorption of the current blocking layer, the optical distribution is limited, and there is the problem that it is difficult to achieve a large coupling coefficient.

SUMMARY OF THE INVENTION

It is a first object of the present invention to provide a DFB and a DBR semiconductor laser with excellent transverse mode control, and stable single longitudinal mode oscillation, that are suitable for mass production and have a stripe-shaped structure. It is a second object of the present invention to provide a DBR semiconductor laser that can be manufactured with fewer crystal growth steps.

A first semiconductor laser device in accordance with the present invention includes a substrate; an active layer formed on the substrate; a semiconductor layer provided with a diffraction grating formed on the active layer; an etch-stop layer formed on the semiconductor layer; a cladding layer provided with a stripe structure, formed on the etch-stop layer; and a current blocking layer formed on the etch-stop layer and arranged at least on a side of said stripe structure. In this semiconductor laser device, the etch-stop layer is formed on the semiconductor layer with the diffraction grating, so that damage to the diffraction grating due to the etching can be prevented.

It is preferable that the refractive index of the current blocking layer is lower than the refractive index of the cladding layer, because this can reduce waveguide losses of the semiconductor laser by suppressing the absorption of laser light by the current blocking layer, and the distribution of the laser light can extend into the diffraction grating below the current blocking layer, so that the coupling coefficient of the diffraction grating can be increased.

It is preferable that in the semiconductor laser device, the etch-stop layer is a $Ga_{1-S}Al_SAs$ layer of a first conductivity type, the current blocking layer is a $Ga_{1-Z}Al_ZAs$ layer of a second conductivity type, the cladding layer is a $Ga_{1-C}Al_CAs$ layer of the first conductivity type, and the relation between C, S, and Z is $1 \geq Z > C > S \geq 0$.

In this semiconductor laser device, the Al composition ratio S of the etch-stop layer is smaller than the Al composition ratios Z and C of the current blocking layer and the cladding layer, which are etched layers, so that during the etching of those etched layers, etching of the diffraction grating layer can be prevented with the etch-stop layer. Furthermore, the Al composition ratio Z of the current blocking layer is larger than the Al composition ratio C of the cladding layer, so that, as mentioned above, the absorption of laser light by the current blocking layer can be prevented, and the laser light distribution in the diffraction grating below the current blocking layer can be expanded.

A method for manufacturing the first semiconductor laser device in accordance with the present invention includes forming an etch-stop layer of $Ga_{1-S}Al_SAs$; forming an etched layer selected from the cladding layer and the current blocking layer of $Ga_{1-U}Al_UAs$ (with $1 \geq U > S \geq 0$); and forming a stripe structure by etching this etched layer with an etchant that selectively etches GaAlAs layers with a higher Al composition ratio. In this manufacturing method, an etchant is used that selectively etches GaAlAs layers with a higher Al ratio (in other words, with higher AlAs crystal composition ratio), and the Al composition ratio of the layers is controlled as described above, so that the etching is stopped by the etch-stop layer, and over-etching of the diffraction grating layer below the etch-stop layer can be prevented. If the etched layer is the current blocking layer, then U corresponds to Z, and if the etched layer is the cladding layer, then U corresponds to C.

It is preferable that the semiconductor laser device further includes a first optical guiding layer of $Ga_{1-Y1}Al_{Y1}As$ (0<Y1<1) of the first conductivity type between the active layer and the diffraction grating layer. It is also preferable that the semiconductor laser device further includes a second optical guiding layer of $Ga_{1-Y2}Al_{Y2}As$ (0<Y2<1) of the first conductivity type between the semiconductor layer with the diffraction grating and the etch-stop layer. It is preferable that the semiconductor layer with the diffraction grating is a layer of $Ga_{1-G}Al_GAs$ ($0 \leq G \leq 1$), and the relation between G and Y2 is Y2>G. It is further preferable that the active layer has a quantum well structure including quantum well layers made of $Ga_{1-X}Al_XAs$ ($0 \leq X < 1$).

A second semiconductor laser device of the present invention is a DBR semiconductor laser device and includes an active layer formed on a substrate, and a current blocking layer formed on the active layer having and a stripe-shaped window, wherein a diffraction grating is formed at least near an end face in the current blocking layer. In this semiconductor laser device, a diffraction grating is formed in the current blocking layer. Therefore, the diffraction grating is formed after forming all layers up to the current blocking layer, and manufacturing can be completed in one further crystal growth process. Since the diffraction grating is formed in the current blocking layer, laser light leaks into the current blocking layer and is propagated, so that the coupling coefficient of the grating element can be made larger.

A method for manufacturing this second DBR semiconductor laser device of the present invention includes forming the current blocking layer on the active layer, partially removing the current blocking layer to form the stripe-shaped window, and forming the diffraction grating at least in a region of the current blocking layer that is near an end face. With this manufacturing method, a DBR semiconductor laser device can be manufactured in which the growth of the layers does not have to be interrupted after forming the diffraction grating.

DESCRIPTION OF THE PREFERRED EMBODIMENTS

The following is a description of a preferred embodiment of the present invention, with reference to the accompanying drawings. First, the first semiconductor laser device shall be explained.

First Embodiment

Figure 1:
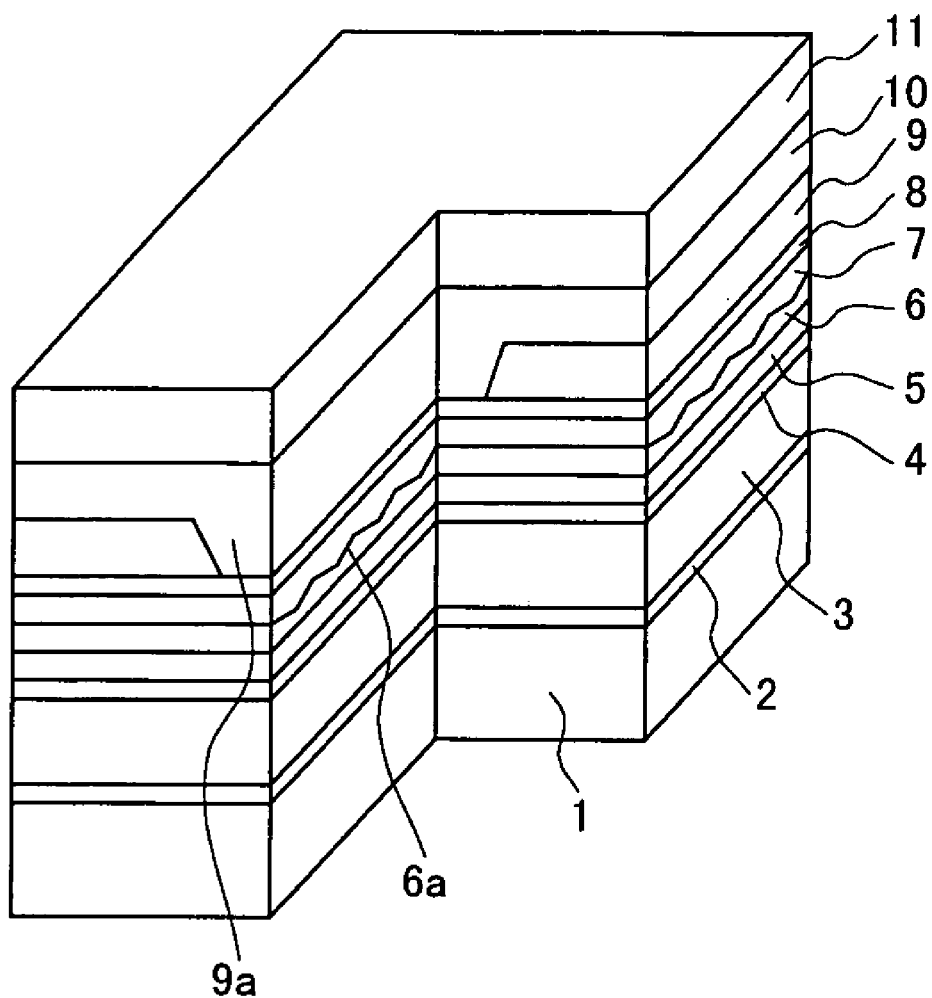
FIG. 1 is a partially cut-away perspective view of an example of a DFB semiconductor laser in accordance with the present invention.

In the DFB semiconductor laser shown in FIG. 1, an n-type GaAs buffer layer 2, an n-type $Ga_{0.5}Al_{0.5}As$ first cladding layer 3, a $Ga_{0.85}Al_{0.15}As$ active layer 4, a p-type $Ga_{0.5}Al_{0.5}As$ first optical guiding layer 5, a p-type $Ga_{0.8}Al_{0.2}As$ diffraction grating layer 6, a p-type $Ga_{0.5}Al_{0.5}As$ second optical guiding layer 7, and a p-type $Ga_{0.8}Al_{0.2}As$ etch-stop layer 8 are formed in that order on top of an n-type GaAs substrate 1. Formed on top of that layering structure is an n-type $Ga_{0.4}Al_{0.6}As$ current blocking layer 9 having a stripe-shaped window 9a for current confinement. Furthermore, a p-type $Ga_{0.5}Al_{0.5}As$ second cladding layer 10 and a p-type GaAs contact layer 11 are formed on the current blocking layer 9 and the stripe-shaped window 9a.

In this laser device, the current injected from the p-type GaAs contact layer 11 is confined by the n-type $Ga_{0.4}Al_{0.6}As$ current blocking layer 9 in the stripe-shaped window 9a, and laser oscillation in the 780 nm band occurs in the active layer 4 below the stripe-shaped window 9a. With this structure, the forbidden band width of the $Ga_{0.4}Al_{0.6}As$ current blocking layer 9 is larger than the forbidden band width of the $Ga_{0.85}Al_{0.15}As$ active layer 4 and the p-type $Ga_{0.5}Al_{0.5}As$ second cladding layer 10, so that there is almost no absorption of laser light by the current blocking layer 9. Consequently, waveguide losses can be reduced considerably.

Since there is almost no optical absorption by the current blocking layer 9, the optical distribution of the laser light is not limited to the space inside the stripe, but extends into the diffraction grating layer below the current blocking layer 9. Consequently, the optical power propagating through the diffraction grating is increased, and it is possible to set a higher coupling coefficient of the diffraction grating, which determines wavelength selectivity. As a result, a superior wavelength selectivity can be accomplished with the diffraction grating 6a, and a single longitudinal mode can be sustained that is not susceptible to changes in temperature or optical output.

In this embodiment, the AlAs crystal composition ratio in the current blocking layer 9 is set higher than the AlAs crystal composition ratio in the second cladding layer 10, to prevent the formation of an antiguide waveguide caused by a decreasing refractive index in the stripe due to the plasma effect during current injection. For example, in this embodiment, the AlAs crystal composition ratio in the current blocking layer 9 is set to 0.6, which is higher than the AlAs crystal composition ratio in the $Ga_{0.5}Al_{0.5}As$ second cladding layer 10. Thus, a stable single transversal mode oscillation can be obtained even at high output powers.

In this embodiment, the AlAs crystal composition ratio in the $Ga_{0.5}Al_{0.5}As$ first optical guiding layer 5 is set considerably higher than the AlAs crystal composition ratio in the active layer 4, so that the carriers are effectively confined in the active layer 4. To obtain a laser oscillation in the 780 nm band, an AlAs crystal composition ratio of at least 0.45 is preferable, and in this embodiment, it is set to 0.5.

It is preferable that the AlAs crystal composition ratio of the $Ga_{0.8}Al_{0.2}As$ etch-stop layer 8 is not higher than 0.3, so that the etching selectivity ratio toward the $Ga_{0.5}Al_{0.5}As$ second cladding layer 10 is high and regrowth thereon is easy. It is also preferable that the etch-stop layer 8 does not absorb the oscillation wavelength of the laser. In the present embodiment, the AlAs crystal composition ratio of the $Ga_{0.8}Al_{0.2}As$ etch-stop layer 8 is set to 0.2.

In the present embodiment, the diffraction grating 6a formed in the diffraction grating layer 6 is formed periodically in the direction of the optical resonator. The period of the diffraction grating is an integer multiple of the wavelength in the medium. Certain wavelengths of the laser light propagating through the optical resonator are selected by Bragg reflection with the diffraction grating 6a. The refractive index difference between the $Ga_{0.8}Al_{0.2}As$ diffraction grating layer 6 and the $Ga_{0.5}Al_{0.5}As$ second optical guiding layer 7, in which the diffraction grating 6a is buried, determines the wavelength selection with the diffraction grating 6a. It is preferable that the AlAs crystal composition ratio of the diffraction grating layer 6 is not higher than 0.3, so that a favorable wavelength selectivity is achieved and regrowth on the diffraction grating layer 6 is easy, and it is preferable that the diffraction grating layer 6 does not absorb the oscillation wavelength of the laser. In the present embodiment, the AlAs crystal composition ratio of the diffraction grating layer 6 is set to 0.2.

It is also preferable that the AlAs crystal composition ratio of the second optical guiding layer 7 is at least 0.5, so that the refractive index difference with respect to the diffraction grating layer 6 is sufficient for single longitudinal modes. In the present invention, it is set to 0.5.

FIGS. 2A to 2F illustrate the manufacturing process for a DFB semiconductor laser in accordance with this embodiment.

Figure 2A:
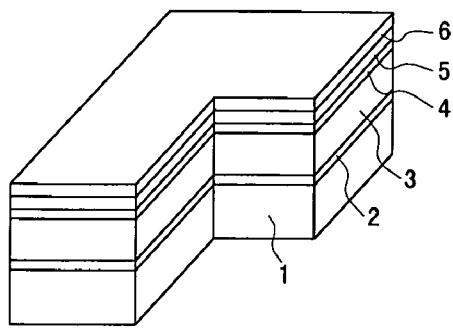
FIGS. 2A to 2F are diagrams illustrating a method for manufacturing the semiconductor laser in FIG. 1.

As shown in FIG. 2A, an n n-type GaAs buffer layer 2 (of 0.5 μm thickness), an n-type $Ga_{0.5}Al_{0.5}As$ first cladding layer 3 (of 1 μm thickness), a multi-quantum well active layer 4 of $Ga_{0.7}Al_{0.8}As$ barrier layers and GaAs well layers, a p-type $Ga_{0.5}Al_{0.5}As$ first optical guiding layer 5 (of 0.06 μm thickness), and a p-type $Ga_{0.8}Al_{0.2}As$ diffraction grating layer 6 (of 0.06 μm thickness) are formed on an n-type GaAs substrate 1 in a first crystal growth process by MOCVD or MBE. It should be noted that throughout this specification layer thicknesses are only given as examples, and the present invention is in no way limited by these numerical values.

Unstrained multiple quantum wells are used for the active layer in the present embodiment, but it is also possible to use strained quantum wells or bulk material. Furthermore, the active layer can be p-type or n-type, or even undoped.

When the diffraction grating layer 6 is formed above the active layer 4, then production with high yield is possible, and there is no decrease in the crystallinity of the active layer due to regrowth.

Figure 2B:
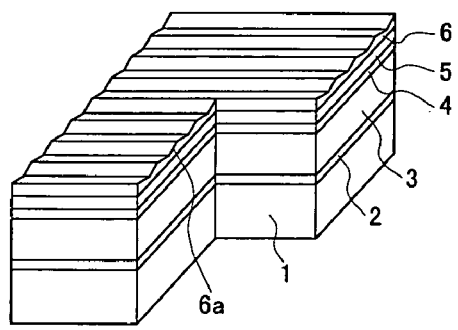

Then, as shown in FIG. 2B, a diffraction grating 6a that is periodic in the direction of the optical resonator is formed in the diffraction grating layer 6 by interference exposure or electron beam exposure and wet etching or dry etching.

Figure 2C:
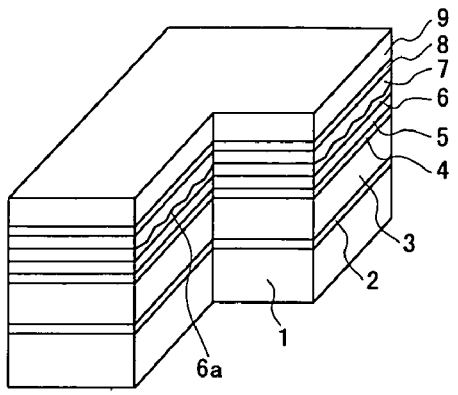

As shown in FIG. 2C, a p-type $Ga_{0.5}Al_{0.5}As$ second optical guiding layer 7 (of 0.06 μm thickness), a p-type $Ga_{0.8}Al_{0.2}As$ etch-stop layer 8 (of 0.01 μm thickness), and an n-type $Ga_{0.4}Al_{0.6}As$ current blocking layer 9 (of 0.6 μm thickness) are formed in a second crystal growth process on the diffraction grating layer 6. When the current blocking layer 9 is too thin, then the confinement of the light in transversal direction becomes too weak, so that the transversal mode becomes unstable. It is preferable that the thickness of the current blocking layer 9 is at least 0.4 μm.

Figure 2D:
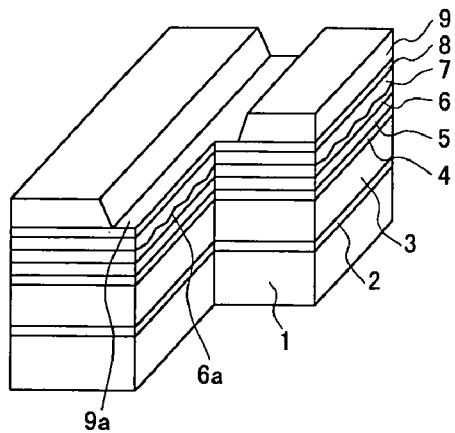

Next, as shown in FIG. 2D, a striped shaped window 9a for current confinement is formed by etching in the $Ga_{0.4}Al_{0.6}As$ current blocking layer 9. Using an etchant such as hydrofluoric acid, which selectively etches layers with a high AlAs crystal composition ratio, it is possible to stop the etching with the etch-stop layer 8 having the composition $Ga_{0.8}Al_{0.2}As$. Therefore, variations in the characteristics due to the etching do not occur, and it is possible to obtain a semiconductor laser suitable for mass production with high yield. Also, different from conventional configurations, the diffraction grating layer 6 and the etch-stop layer 8 are formed separately, so that the shape of the diffraction grating 6a is not degraded by the etching of the stripe.

For the stripe-shaped groove, a regular mesa shape is preferable to an inverted mesa shape, because with the regular mesa shape, crystal growth for filling up the stripe groove is easier, and the yield can be increased.

Figure 2E:
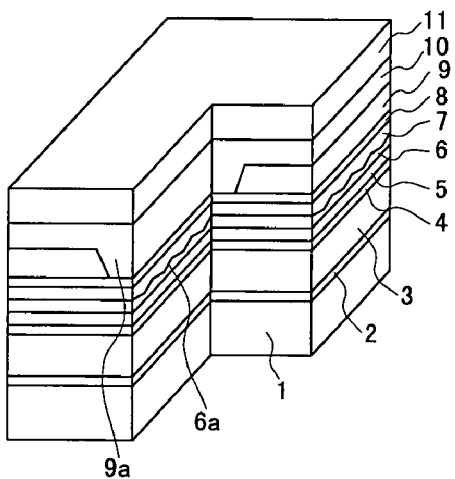

In a third crystal growth process, a p-type $Ga_{0.5}Al_{0.5}As$ second cladding layer 10 (of 2 μm thickness) and a p-type GaAs contact layer 11 (of 2 μm thickness) are formed on the current blocking layer 9 including the stripe shaped window, as shown in FIG. 2E.

Figure 2F:
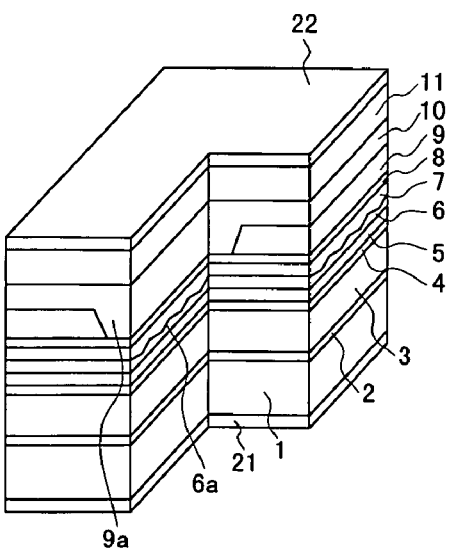

Finally, an n-electrode 21 and a p-electrode 22 are formed on the n-type GaAs substrate 1 and the p-type GaAs contact layer 11 respectively, as shown in FIG. 2F.

To make high output power possible, a coating of low reflectivity of 5% can be applied to the front facet of the laser where the laser light is emitted. If a non-reflective coating of less than 1% reflectivity is applied to the rear facet, then reflections at the rear facet independent from the diffraction grating can be prevented, and longitudinal mode control with the diffraction grating can be ensured even better.

Second Embodiment

Figure 3:
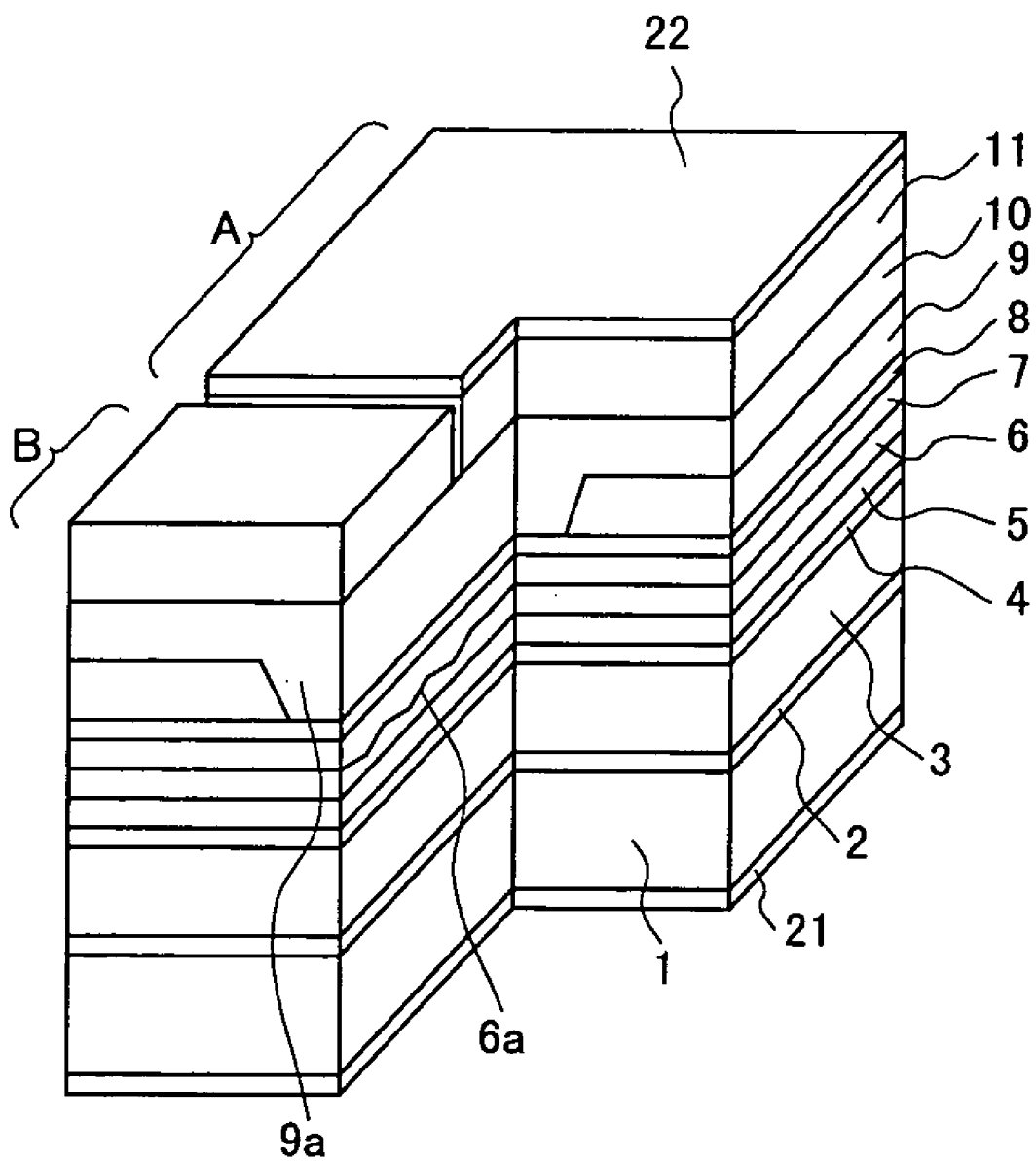
FIG. 3 is a partially cut-away perspective view of an example of a DBR semiconductor laser in accordance with the present invention.
Figure 4:
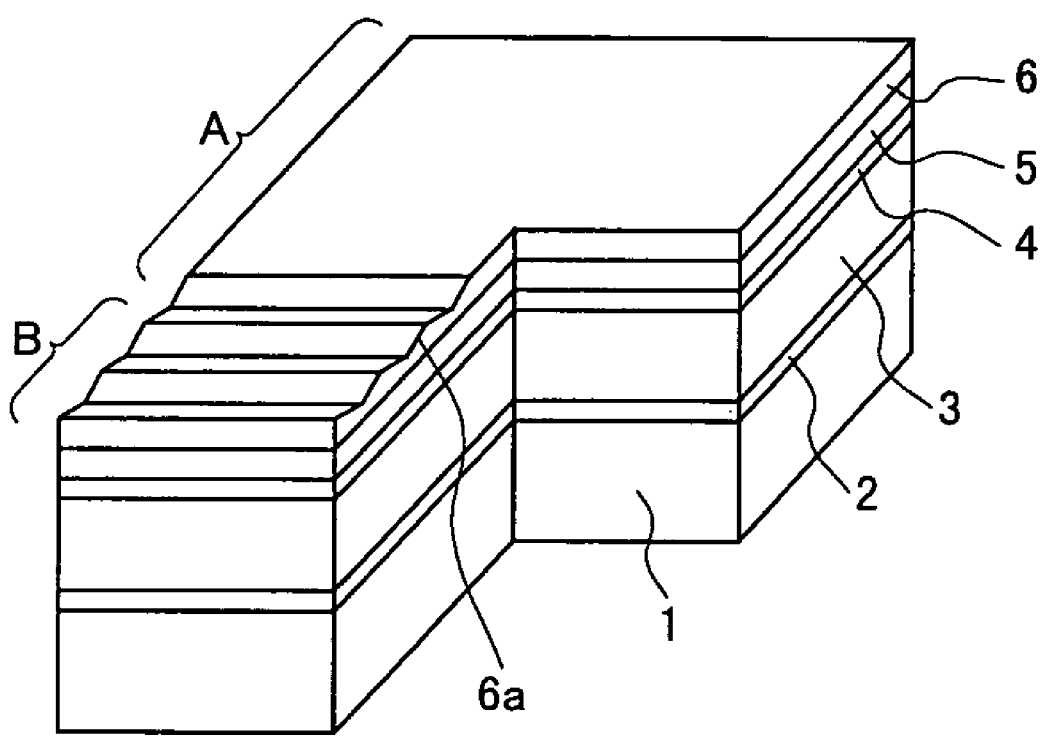
FIG. 4 is a partially cut-away perspective view illustrating the situation after a diffraction grating has been formed in the surface of the diffraction grating layer in a method for manufacturing the semiconductor laser in FIG. 3.

FIG. 3 shows a DBR semiconductor laser device in accordance with a second embodiment of the present invention. As shown in FIG. 3, in this semiconductor laser, the diffraction grating 6a is formed only at a distributed reflection region B of the diffraction grating layer 6. The method for manufacturing this structure is the same as for the first embodiment up to the formation of the p-type $Ga_{0.8}Al_{0.2}As$ diffraction grating layer 6 in the first crystal growth process. Then, as shown in FIG. 4, the diffraction grating 6a is formed only in the distributed reflection region B by etching only the distributed reflection region B and not the active region A in the surface of the diffraction grating layer 6. In this embodiment, the length of the active region was set to 500 μm, and the length of the distributed reflection region was set to 300 μm.

Next, as in the first embodiment, a second optical guiding layer 7, an etch-stop layer 8, and a current blocking layer 9 are formed. After a window 9a serving as a current channel has been etched into the current blocking layer 9, a p-type second cladding layer 10 and a p-type GaAs contact layer 11 are grown.

In order to electrically separate the active region A and the distributed reflection region B, the p-type GaAs contact layer 11 is eliminated by etching over a width of 30 μm between the active region A and the distributed reflection region B. Then, an n-type electrode 21 is formed on the GaAs substrate 1 and a p-type electrode 22 is formed on the p-type GaAs contact layer of the active region A, thereby completing the semiconductor laser device shown in FIG. 3.

Third Embodiment

Figure 5:
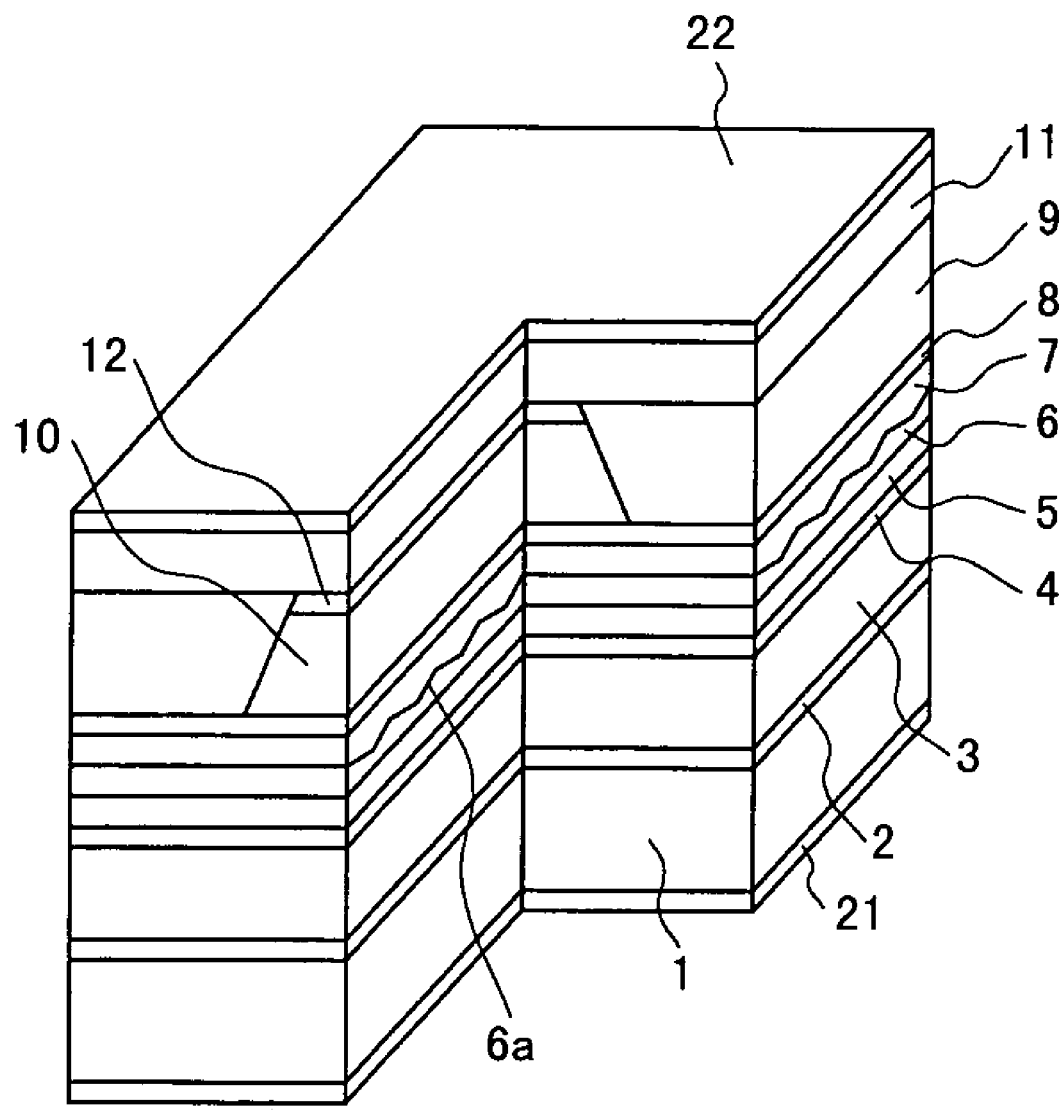
FIG. 5 is a partially cut-away perspective view illustrating another example of a DFB semiconductor laser in accordance with the present invention.

FIG. 5 shows a DBR semiconductor laser device in accordance with a third embodiment of the present invention. In this semiconductor structure, the second cladding layer 10 is provided with a ridge shape, and for current confinement, an n-type $Ga_{0.4}Al_{0.6}As$ current blocking layer 9 is formed in the region outside the ridge serving as a current channel. Numeral 12 denotes a p-type GaAs protective layer, and numeral 11 denotes a p-type GaAs contact layer.

Figure 6A:
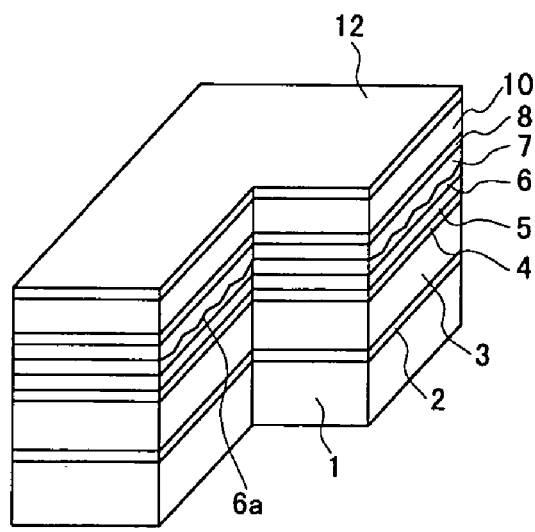
FIGS. 6A to 6C are diagrams illustrating a method for manufacturing the semiconductor laser in FIG. 5.

A method for manufacturing this semiconductor laser is shown in FIG. 6. First, as in the first and second embodiments, the layers up to the diffraction grating layer are formed in a first crystal growth process, then the diffraction grating 6A is formed, and the layers up to the protective layer 12 are formed in a second crystal growth process, as shown in FIG. 6A.

Figure 6B:
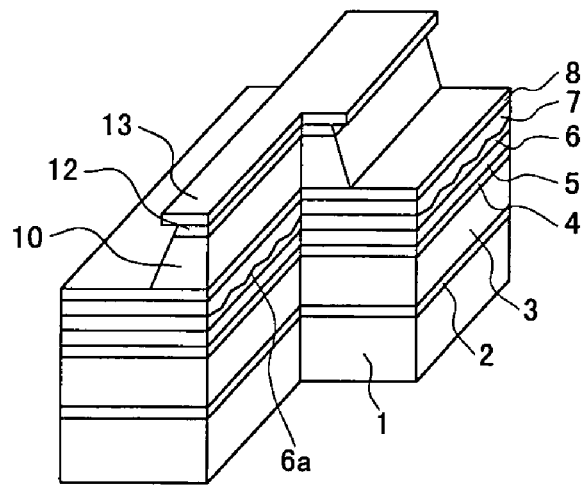

Then, as shown in FIG. 6B, a stripe-shaped dielectric film 13, for example of nitride (silicon nitride or tungsten nitride) or silicon oxide, is formed, and etching is performed using this dielectric film 13 as a mask, forming a ridge. The etching is stopped selectively with the etch-stop layer 8.

Figure 6C:
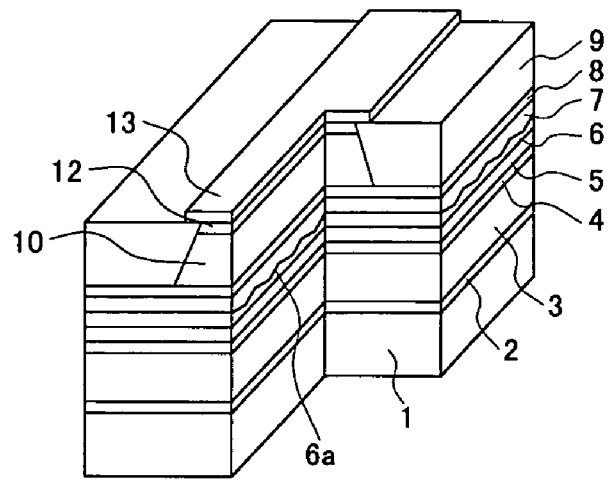

Then, using the dielectric film 13, an n-type $Ga_{0.4}Al_{0.6}As$ current blocking layer 9 is grown selectively in the region outside the ridge in a third crystal growth process, as shown in FIG. 6C.

Also here, a regular mesa shape is preferable to an inverted mesa shape for the ridge shape, because with the inverted mesa shape, crystal growth is more difficult than with the regular mesa shape, which may reduce the yield.

Then, the dielectric film 13 is eliminated, and a p-type GaAs contact layer 11 is formed in a fourth crystal growth process. Finally, an n-type electrode 21 is formed on the n-type GaAs substrate 1 and a p-type electrode 22 is formed on the p-type GaAs contact layer 11, thereby completing the semiconductor laser device shown in FIG. 5.

Fourth Embodiment

Figure 7:
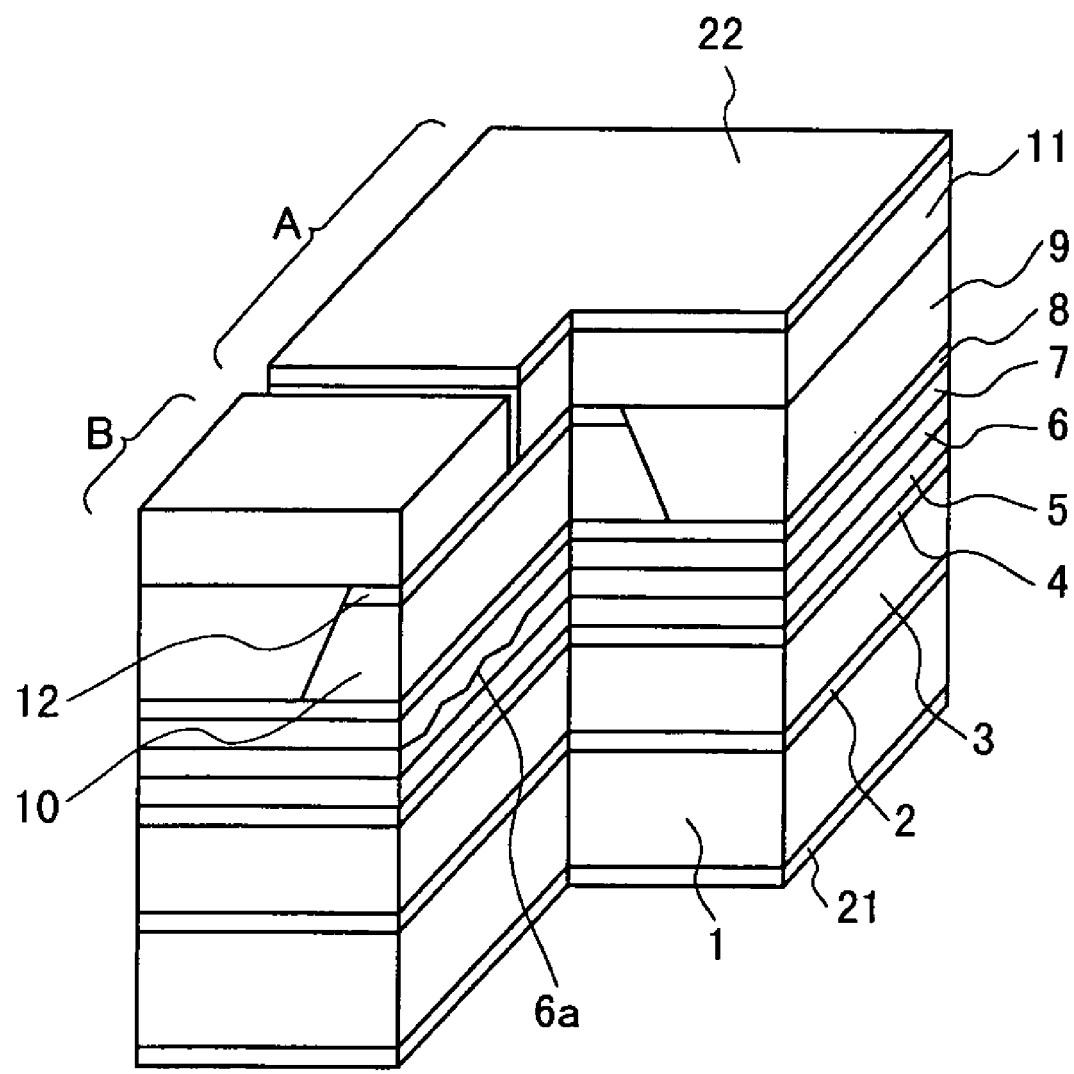
FIG. 7 is a partially cut-away perspective view illustrating another example of a DBR semiconductor laser in accordance with the present invention.

FIG. 7 shows a DBR semiconductor laser device in accordance with a fourth embodiment of the present invention. In this semiconductor laser, as in the third embodiment, the second cladding layer 10 is provided with a ridge shape, and for current confinement, an n-type $Ga_{0.4}Al_{0.6}As$ current blocking layer 9 is formed in the region outside the ridge serving as a current channel. The diffraction grating 6a is formed only in the distributed reflection region B of the diffraction grating layer 6.

Figure 8:
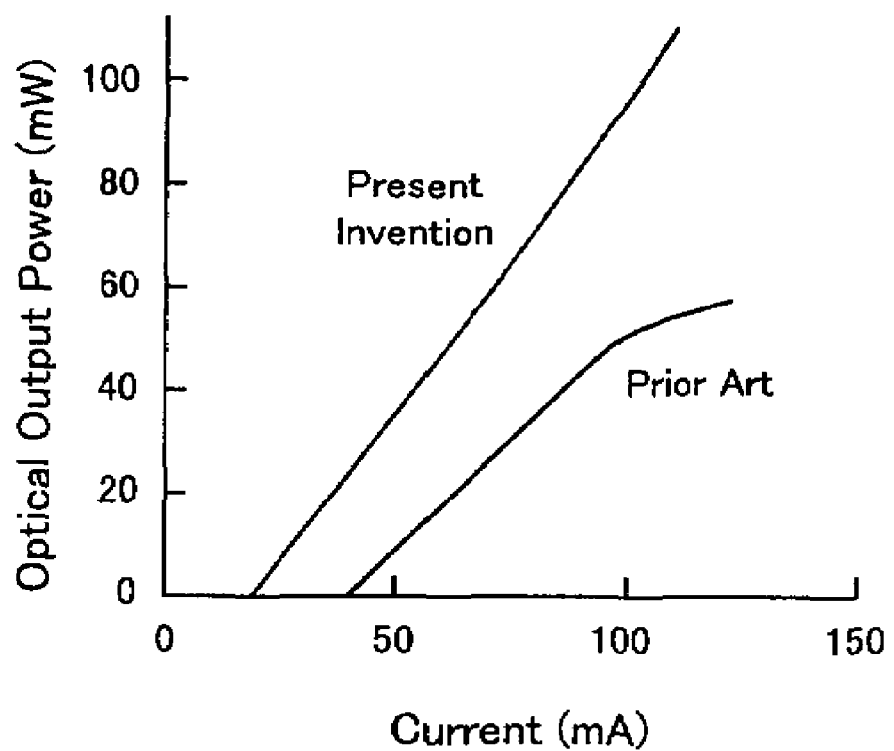
FIG. 8 is a graph showing an example of the current—optical output characteristics of a semiconductor laser of the present invention.

FIG. 8 is a graph showing the current—optical output characteristics of a semiconductor laser in accordance with an embodiment of the present invention. Compared to a conventional device using GaAs for the current blocking layer, there is substantially no light absorption in the current blocking layer, so that a current reduction is accomplished. Due to this current reduction, the element's generation of heat during high output power can be suppressed, and a stable oscillation in single longitudinal mode can be attained even at output powers of 100 mW or higher. Moreover, stable oscillation with a single transverse mode is possible up to high output powers.

The threshold can be reduced by providing the active layer with a quantum well structure, so that the current can be reduced and the output power can be increased. If multiple quantum wells of 10 nm thickness $Ga_{0.95}Al_{0.05}As$ well layers and 4 nm thick $Ga_{0.7}Al_{0.3}As$ barrier layers are used for the quantum well structure for oscillation in the 780 nm band, then an optical output of 200 mW or more can be attained.

The following is an explanation of the second semiconductor laser device.

Fifth Embodiment

Figure 9:
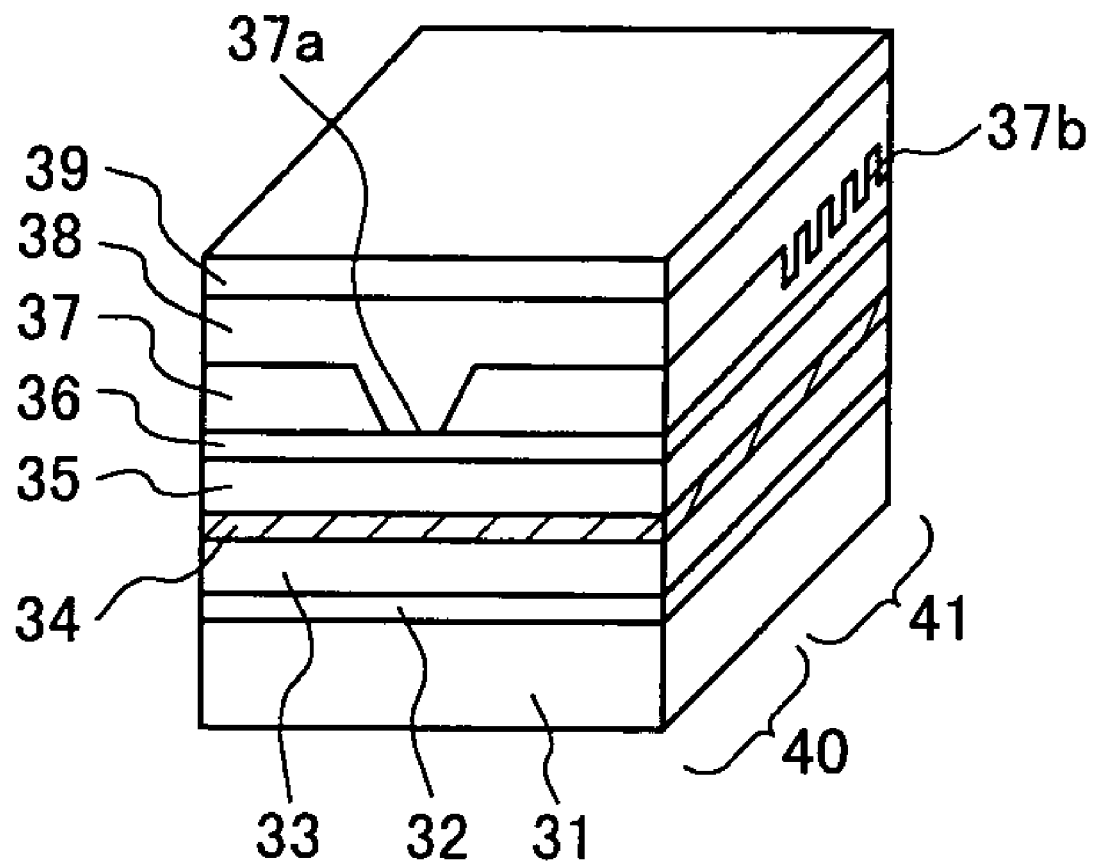
FIG. 9 is a partially cut-away perspective view illustrating yet another example of a DBR semiconductor laser in accordance with the present invention.

FIG. 9 shows a DBR semiconductor laser device in accordance with the present invention. In this semiconductor laser, a buffer layer 32 of n-type GaAs, a first cladding layer 33 of n-type $Ga_{0.5}Al_{0.5}As$, an active layer 34 of $Ga_{0.85}Al_{0.15}As$, a second cladding layer 35 of p-type $Ga_{0.5}Al_{0.5}As$, a grating layer 36 of p-type $Ga_{0.8}Al_{0.2}As$ having a diffraction grating 37b in a distributed Bragg reflection region 41, and a current blocking layer 37 of n-type $Ga_{0.4}Al_{0.6}As$, having a diffraction grating 37b in a distributed Bragg reflection region 41 and a stripe-shaped window 37a serving as a current channel for current confinement, are formed on a semiconductor substrate 31 of n-type GaAs.

The period of the diffraction grating is an integer multiple of the wavelength in the medium. A third cladding layer 38 of p-type $Ga_{0.5}Al_{0.5}As$ is formed on the current blocking layer 37, and a contact layer 39 of p-type GaAs is formed on top of that. An active region 40 is formed adjacent to the distributed Bragg reflection region 41.

With this semiconductor laser, the diffraction grating 37b is formed in the current blocking layer 37 with the striped-shaped window 37a and serves as the distributed Bragg reflection region 41, so that the DBR laser structure is accomplished simply by forming the third cladding layer 38 and the contact layer 39 on top of the current blocking layer 37. That is to say, it takes only two crystal growth processes to manufacture the DBR laser structure on the semiconductor substrate 31. In other words, the crystal growth for manufacturing the DBR laser is interrupted only once, so that the DBR laser structure can be manufactured with high yield.

Furthermore, the diffraction grating is formed on the current blocking layer 37, and the laser light leaks into the current blocking layer 37 where it is propagated, so that the coupling coefficient of the diffraction grating can be made large. Thus, a DBR laser with high emission wavelength selectivity can be obtained.

Moreover, the forbidden band width of the second optical guiding layer 37 of n-type $Ga_{0.4}Al_{0.6}As$ is larger than the forbidden band width of the active layer 34 of $Ga_{0.85}Al_{0.15}As$, so that there is almost no optical absorption in the current blocking layer 37, and a DBR laser with low operating current and low waveguide losses can be obtained.

In this semiconductor laser, the current injected from the contact layer 39 of p-type GaAs is confined in the stripe-shaped window 37a, and a laser oscillation in the 780 nm band occurs in the active layer 34 of $Ga_{0.85}Al_{0.15}As$ below the stripe-shaped window 37a. Here, the forbidden band of the second cladding layer 35 of p-type $Ga_{0.85}Al_{0.5}As$ is sufficiently larger than that in the active layer 34 of $Ga_{0.85}Al_{0.15}As$, and the carriers are confined effectively in the active layer 34, so that oscillation in the visual spectrum is possible. In order to attain a laser oscillation in the 780 nm band, the AlAs crystal composition ratio should be set to at least about 0.35, and in the present embodiment it was set to 0.5.

Furthermore, the forbidden band of the current blocking layer 37 is also larger than the forbidden band of the third cladding layer 38, so that the current can be confined effectively to the stripe-shaped window 37a.

In this laser device structure, due to the diffraction grating 37a, the refractive index in the medium, that is, in the waveguide, changes periodically, and light advancing in parallel to the resonator direction is periodically reflected. Furthermore, the diffraction grating 37b has a period that is an integer multiple of the wavelength in the medium, and the light reflected by the diffraction grating 37b is coherent, so that the wavelength selectivity is increased. Thus, single longitudinal mode oscillation can be maintained with greater stability towards temperature changes, variations in optical output power, and high-speed modulation.

FIG. 10 illustrates a method for manufacturing this semiconductor laser.

Figure 10A:
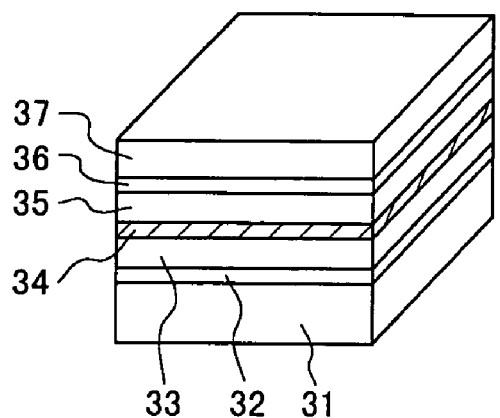
FIGS. 10A to 10C are diagrams illustrating a method for manufacturing the semiconductor laser in FIG. 9.
Figure 10B:
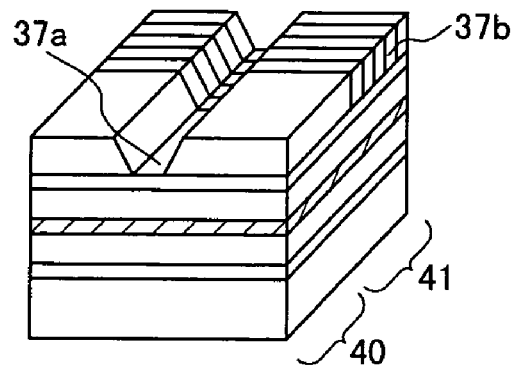

As shown in FIG. 10A, a buffer layer 32 of n-type GaAs, a first cladding layer 33 of n-type $Ga_{0.5}Al_{0.5}As$, an active layer 34 of $Ga_{0.85}Al_{0.15}As$, a second cladding layer 35 of p-type $Ga_{0.5}Al_{0.5}As$, a grating layer 36 of p-type $Ga_{0.8}Al_{0.2}As$, and a current blocking layer 37 of n-type $Ga_{0.4}Al_{0.6}As$ are formed in that order on a substrate 31 of n-type GaAs by organic gas-phase metal epitaxial growth (MOCVD) or molecular beam epitaxy (MBE), Then, as shown in FIG. 10B, a stripe-shaped window 37a is formed by etching in the current blocking layer 37. At first, the current blocking layer 37 of n-type $Ga_{0.4}Al_{0.6}As$ is etched with an etchant with almost no selectivity towards the AlAs crystal composition ratio, such as sulfuric acid, and then the current blocking layer 37 is selectively etched with an etchant with high selectivity towards the AlAs crystal composition ratio, such as a hydrofluoric acid or phosphoric acid system. When etching, the grating layer 36 of p-type $Ga_{0.8}Al_{0.2}As$ acts as an etch-stop layer.

Finally, with two-beam interference exposure using a He—Cd laser as the light source, a diffraction grating was patterned in the resist film, and a diffraction grating 37b was formed by etching in the grating layer 36 and the current blocking layer 37 of the distributed Bragg reflection region 41.

Figure 10C:
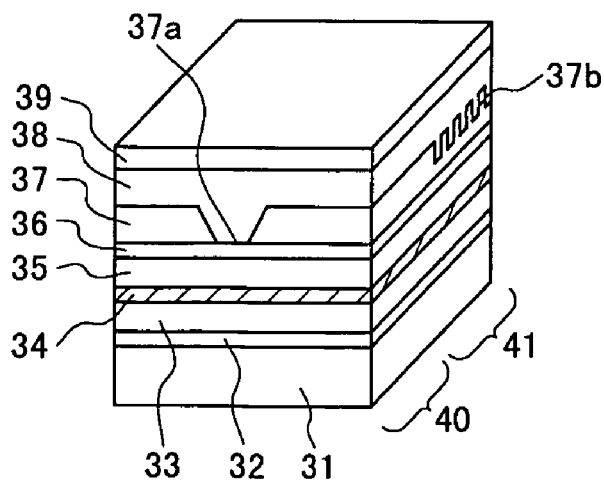
Figure 11:
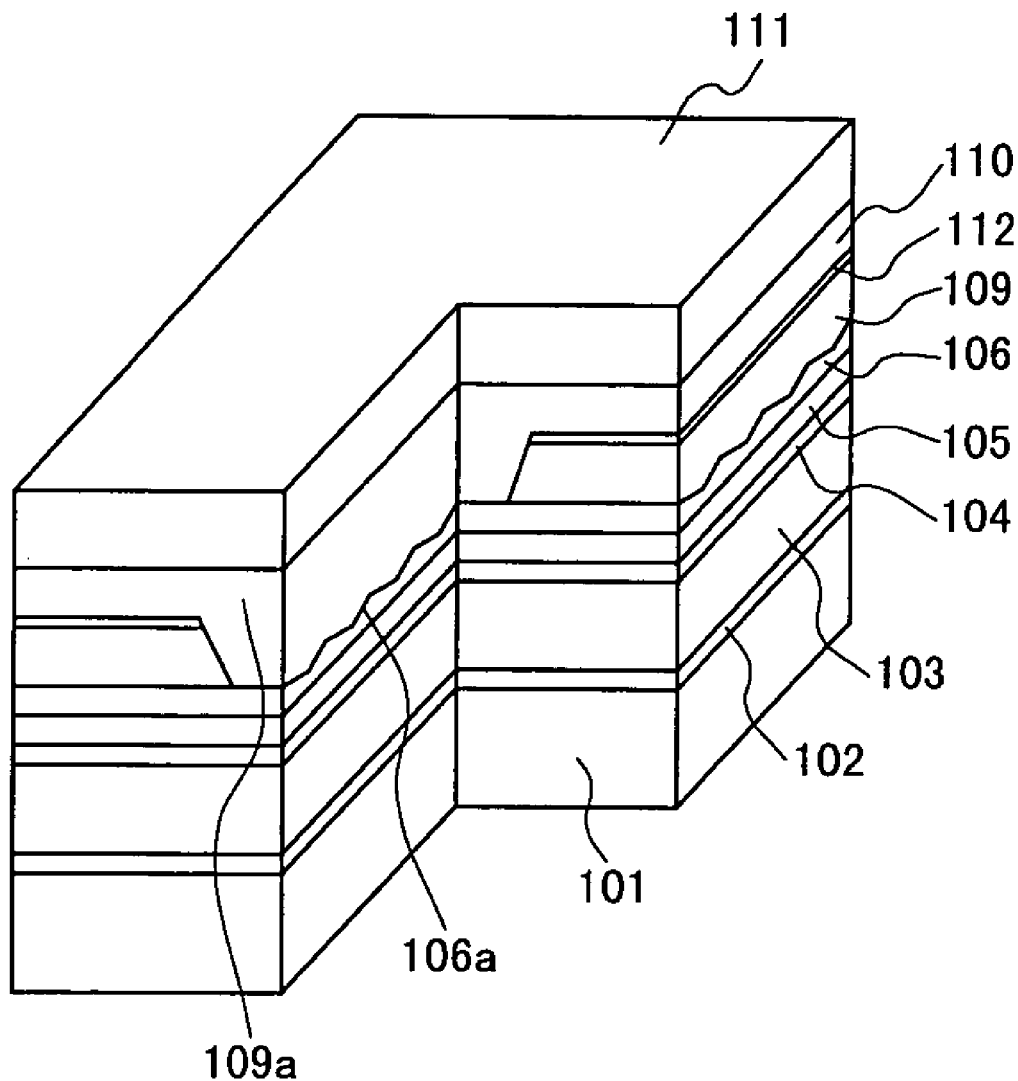
FIG. 11 is a partially cut-away perspective view of a conventional semiconductor laser.
Figure 12A:
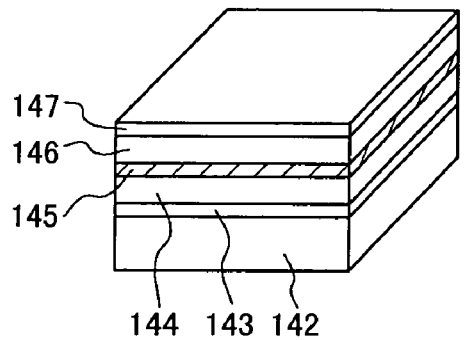
FIGS. 12A to 12F are diagrams illustrating a conventional method for manufacturing a semiconductor laser.
Figure 12D:
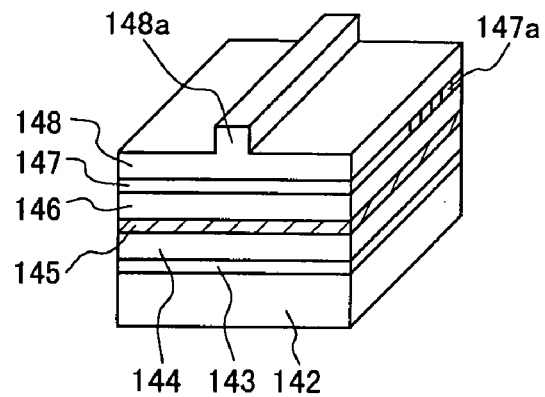
Figure 12B:
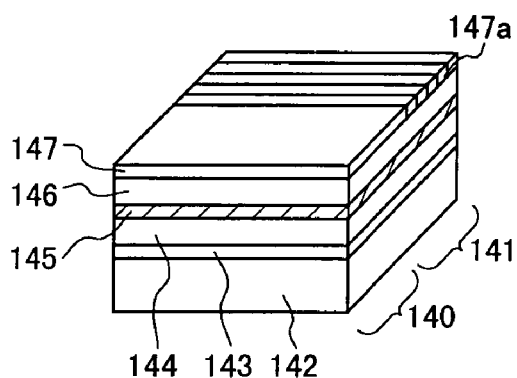
Figure 12E:
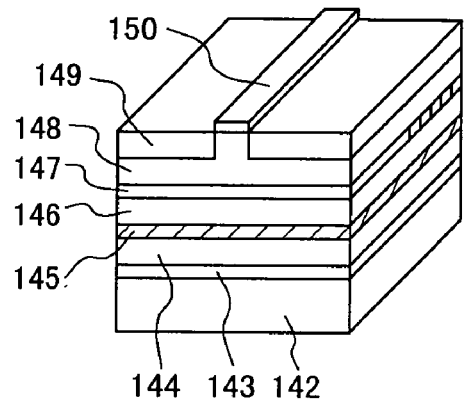
Figure 12C:
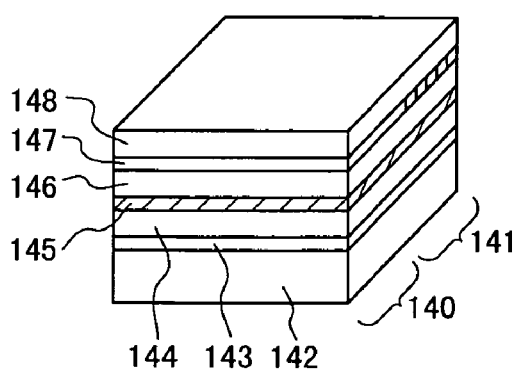
Figure 12F:
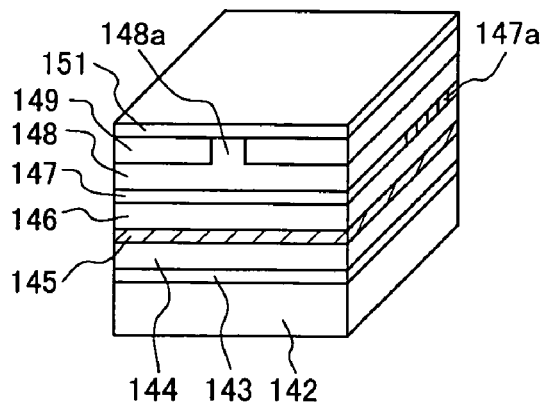

Then, as shown in FIG. 10C, a third cladding layer 38 of p-type $Ga_{0.5}Al_{0.5}As$ and a contact layer 39 of p-type GaAs were formed by regrowing with MOCVD or MBE.

Finally, electrodes were formed on the semiconductor substrate 31 of n-type GaAs and the contact layer 39 of p-type GaAs.

In this semiconductor laser, a diffraction grating 37b is formed in the current blocking layer 37, so that after the diffraction grating 37b has been formed, the DBR laser structure can be manufactured without interrupting the crystal growth. Therefore, the manufacturing yield for the DBR laser can be increased.

In FIGS. 10A to 10C, the conductivity type of the active layer 34 is not particularly specified, and it can be p-type, n-type or undoped.

Moreover, this embodiment has been explained for a semiconductor substrate 31 of n-type GaAs and a current blocking layer 37 of n-type $Ga_{0.4}Al_{0.6}As$, but it is also possible to use a semiconductor substrate 31 of p-type GaAs and a p-type current blocking layer 37. Since the forbidden band of the current blocking layer 37 is large, electron scattering can be a suppressed, and a p-type current blocking layer can be realized with a p-type GaAlAs layer with a large forbidden band, that is, with high AlAs crystal composition ratio.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description. All changes that come within the meaning and range of equivalency of the claims are intended to be embraced therein.

What is claimed is:

1. A semiconductor laser device, comprising:
   a substrate;
   an active layer formed on the substrate;
   an optical guiding layer on the active layer;
   an etch-stop layer formed on the optical guiding layer;
   a cladding layer provided with a stripe structure, formed on the etch-stop layer;
   a current blocking layer formed on the etch-stop layer and arranged at least on the sides of said stripe structure, the current blocking layer having transparency with respect to light radiated from the active layer; and
   a semiconductor layer provided with a diffraction grating arranged between the active layer and the optical guiding layer;
   wherein the substrate, the active layer, the etch-stop layer, the cladding layer, the current blocking layer, and the semiconductor layer are composed of III–V group compounds, wherein the etch-stop layer and the optical guiding layer are provided at least under the stripe structure, and the cladding layer is not in contact with the optical guiding layer and wherein the etch-stop layer either has a content of Al smaller than a content of Al in the current blocking layer and in the optical guiding layer, or has no Al, and the etch-stop layer is present over an entirety of a lower principal surface of the current blocking layer.

2. The semiconductor laser device according to claim 1, wherein the refractive index of the current blocking layer is lower than the refractive index of the cladding layer.

3. The semiconductor laser device according to claim 1, wherein the stripe-shaped structure is of regular mesa shape.

4. The semiconductor laser device according to claim 1, wherein the etch-stop layer is a $Ga_{1-S}Al_SAs$ layer of a first conductivity type, the current blocking layer is a $Ga_{1-Z}Al_ZAs$ layer of a second conductivity type, the cladding layer is a $Ga_{1-C}Al_CAs$ layer of the first conductivity type, and the relation between C, S, and Z is $1 \geq Z > C > S \geq 0$.

5. The semiconductor laser device according to claim 4, wherein S is not more than 0.3.

6. The semiconductor laser device according to claim 4, further comprising a first optical guiding layer of $Ga_{1-Y1}Al_{Y1}As$ ($0<Y1<1$) of the first conductivity type between the active layer and the diffraction grating layer.

7. The semiconductor laser device according to claim 4, further comprising a second optical guiding layer of $Ga_{1-Y2}Al_{Y2}As$ ($0<Y2<1$) of the first conductivity type between the semiconductor layer with the diffraction grating and the etch-stop layer, wherein the semiconductor layer is a layer of $Ga_{1-G}Al_GAs$ ($0 \leq G \leq 1$), and the relation between G and Y2 is $Y2>G$.

8. The semiconductor laser device according to claim 4, wherein the active layer has a quantum well structure including well layers made of $Ga_{1-X}Al_XAs$ ($0 \leq X \leq 1$).

9. The semiconductor laser device according to claim 1, wherein the semiconductor layer with the diffraction grating comprises a region at which the diffraction grating is formed and a region at which the diffraction grating is not formed.

10. The semiconductor laser device according to claim 1, wherein the diffraction grating is formed at least near an end face in the semiconductor layer.

11. The semiconductor laser device according to claim 1, wherein the optical guiding layer and the etch-stop layer comprise Al, and wherein the composition ratio of Al in the optical guiding layer is higher than that of Al in the etch-stop layer.

12. A distributed Bragg reflection semiconductor laser device, comprising:
a substrate;
an active layer formed on the substrate;
an optical guiding layer formed on the active layer;
an etch-stop layer formed on the optical guiding layer; and
a current blocking layer formed on the etch-stop layer and having a stripe-shape window, the current blocking layer having transparency with respect to light radiated from the active layer;
a cladding layer formed on the current blocking layer and exposed to the etch-stop layer at the stripe-shaped window;
wherein the etch-stop layer has a content of Al that is either smaller than a content of Al in the cladding layer, or contains no Al, and the etch-stop layer is present over an entirety of a principal interface between the optical guiding layer and the cladding layer;
wherein a diffraction grating is formed at least near an end face in a surface of the current blocking layer, and
wherein the substrate, the active layer, and the current blocking layer are composed of III–V group compounds.

13. The semiconductor laser device according to claim 12, wherein grooves forming the diffraction grating are arranged along a longitudinal direction of the stripe-shape window.

14. The semiconductor laser device according to claim 12, wherein the period of the diffraction grating is an integer multiple of the wavelength of light that can propagate through its medium.

15. The semiconductor laser device according to claim 12, wherein a forbidden band width of the current blocking layer is larger than a forbidden band width of the active layer.

16. The semiconductor laser device according to claim 12, further comprising a cladding layer formed on the stripe-shaped window, wherein a forbidden band width of the current blocking layer is larger than a forbidden band width of the cladding layer.

17. A disturbed Bragg reflection semiconductor laser device, comprising:
a substrate;
an active layer formed on the substrate; and
a current blocking layer formed on the active layer and having a stripe-shaped window,
the current blocking layer being a $Ga_{1-Z}Al_ZAs$ layer, wherein $0 \leq Z \leq 1$, wherein a forbidden band width of the current blocking layer is larger than a forbidden band width of the active layer,
wherein a diffraction grating is formed at least near an end face in the current blocking layer.

18. A semiconductor laser device, comprising:
a substrate;
an active layer formed on the substrate;
an optical guiding layer on the active layer;
an etch-stop layer formed on the optical guiding layer;
a cladding layer provided with a stripe structure, formed on the etch-stop layer;
a current blocking layer formed on the etch-stop layer and arranged at least on the sides of said stripe structure, the current blocking layer being a $Ga_{1-Z}Al_ZAs$ layer, where $0 \leq Z \leq 1$, wherein a forbidden band width of the current blocking layer is larger than a forbidden band width of the active layer; and
a semiconductor layer provided with a diffraction grating arranged between the active layer and the optical guiding layer;
wherein the etch-stop layer has a content of Al either smaller than a content of Al in the optical guiding layer, or contains no Al, and the etch-stop layer is formed over an entirety of a principal interface between the optical guiding layer and the current blocking layer; and
wherein the etch-stop layer and the optical guiding layer are provided at least under the stripe structure, and the cladding layer is not in contact with the optical guiding layer.

19. The semiconductor laser device according to claim 18, wherein the optical guiding layer and the etch-stop layer comprise Al, and wherein the composition ratio of Al in the optical guiding layer is higher than that of Al in the etch-stop layer.

* * * * *